(12) United States Patent
Nakamura

(10) Patent No.: US 6,914,222 B2
(45) Date of Patent: Jul. 5, 2005

(54) WAFER HEATING APPARATUS

(75) Inventor: Tsunehiko Nakamura, Kokubu (JP)

(73) Assignee: Kyocera Corporation, Kyoto (JP)

(*) Notice: Subject to any disclaimer, the term of this patent is extended or adjusted under 35 U.S.C. 154(b) by 41 days.

(21) Appl. No.: 10/740,370

(22) Filed: Dec. 18, 2003

(65) Prior Publication Data

US 2004/0149719 A1 Aug. 5, 2004

(30) Foreign Application Priority Data

Dec. 20, 2002 (JP) .................................... P 2002-370854

(51) Int. Cl.[7] .............................................. H05B 3/68
(52) U.S. Cl. .................................. 219/444.1; 219/544
(58) Field of Search .......................... 219/443.1, 444.1, 219/445.1, 446.1, 448.11, 468.1, 466.1, 461.2, 544, 546; 118/724, 725

(56) References Cited

U.S. PATENT DOCUMENTS

| | | | | |
|---|---|---|---|---|
| 5,306,895 A | * | 4/1994 | Ushikoshi et al. | 219/385 |
| 5,635,093 A | * | 6/1997 | Arena et al. | 219/444.1 |
| 5,877,475 A | * | 3/1999 | Hecht et al. | 219/448.11 |
| 6,376,808 B2 | * | 4/2002 | Tachikawa et al. | 219/444.1 |
| 2002/0134775 A1 | * | 9/2002 | Ohashi et al. | 219/444.1 |

FOREIGN PATENT DOCUMENTS

| JP | 04-098784 | 3/1992 |
|---|---|---|
| JP | 09-45752 | 2/1997 |
| JP | 11-283729 | 10/1999 |
| JP | 2001-085144 | 3/2001 |
| JP | 2001-338862 | 12/2001 |
| JP | 2002-100559 | 4/2002 |

* cited by examiner

Primary Examiner—Sang Paik
(74) Attorney, Agent, or Firm—Hogan & Hartson LLP

(57) ABSTRACT

To provide a wafer heating apparatus that can measure a surface temperature of a wafer accurately and responsively. A front surface of a ceramic plate 2 serves as a mounting surface on which a wafer is placed, and a rear surface or an inner portion of the ceramic plate 2 is formed with a resistance heating element 5. A recess 9 is formed in the rear surface of the ceramic plate 2. A temperature measuring member formed of a temperature sensor 8a and leads 8 is inserted in the recess 9 so as to be held by filling 17. In the wafer heating apparatus, a length along the leads from the front of the protective tube to a point where the leads are exposed from the filling is set to 5 to 30 times an outer diameter of the protective tube.

6 Claims, 8 Drawing Sheets

WAFER HEATING APPARATUS

BACKGROUND OF THE INVENTION

The present invention relates to a wafer heating apparatus mainly used for heating a wafer.

Wafer heating apparatus are used for supporting wafers on their mounting plates, such as semiconductor wafers, liquid crystal substrates or other circuit substrates (hereinafter called simply "wafer"), and heating conductive and insulating films applied onto the wafer, forming circuit elements thereon, or for forming light sensitive resist films by drying and heating liquid films applied onto the wafers.

For example, in the semiconductor device fabrication industry, wafer heating apparatuses have been used to heat semiconductor wafers in the processes of formation of conductive or insulating films, photoresist films, or of etching treatments of such films.

In conventional apparatuses, a batch type of apparatus has been used which has performed film treatment of a plurality of wafers collectively at one time. However, as wafers have, recently, increased from 8 to 12 inches in diameter, there has been used an apparatus which heat treats a single wafer at one time to improve its processing precision. However, this single-wafer treatment type of apparatus limits the number of wafers to be processed at one time to only one, and thus, requires shortened time taken for treating the single wafer. For that reason, the wafer heating apparatus is required to achieve an improvement in the precision of the heating temperature as well as reduction of heating time and prompt placing and displacing of the wafer on the apparatus.

As an example of the wafer heating apparatus as mentioned above, a wafer heating apparatus 21 shown in JP-A-11-283729, for example, is exemplified. As shown in FIG. 8, the wafer heating apparatus 21 is mainly composed of a casing 31, a ceramic plate 22 and a stainless plate 33 as a reflection plate. The casing 31 is a bottomed metallic member (which is herein an aluminum member) and its upper portion is provided with an opening 34 that is circular in cross section. A central portion of this casing 31 is formed with three holes 35 for passing through wafer-supporting pins (not shown). If the wafer-supporting pins passed through the holes 35 are moved up and down, it is possible to pass a wafer W to a carrier machine or possible to receive a wafer W from the carrier machine. In a conductive terminal portion for a resistance heating element 25 shown in FIG. 9, conductive terminals 27 are brazed. The conductive terminal portion is so constructed that the conductive terminals 27 are passed through holes 57 formed in the stainless plate 33. Several lead extraction holes 36 are formed in an outer circumferential portion of the bottom 31a. Leads not shown for supplying a resistance heating element with electric current are passed through the holes 36, and said leads are connected to the conductive terminals 27.

As ceramic materials constituting a ceramic plate 22, nitride ceramics or carbide ceramics are used, and, as shown in FIG. 9, there is proposed the wafer heating apparatus 21 which energizes a plurality of concentrically formed patterns to heat the ceramic plate 22.

In such a wafer heating apparatus 21, it is important to control the wafer W at a uniform temperature as well as to accurately measure the temperature of the wafer W in order to heat a resist film uniformly. Therefore, temperature sensors for measuring temperatures of the wafer W are used, and the temperature sensors are fitted to recesses 23 of the wafer heating apparatus.

JP-A-9-45652 discloses a method of disposing a temperature sensor 150 which measures a temperature of a wafer W placed on a wafer heating apparatus and controlling the temperature of a front surface 40a of a metal plate 40 is controlled as shown in FIG. 10. As the method of enhancing precision in temperature control attributable to precision in the temperature of the plate 40 and the response thereof, there is disclosed a method in which a temperature difference in the longitudinal direction of the temperature sensor 150 is made smaller and the temperature sensor 150 is disposed in a manner so as to be parallel to the upper surface of the plate 40. In the temperature sensor, the temperature sensor 150 made of Pt is inserted into a protective tube 151 and disposed to be parallel to the front surface 40aof the plate 40.

Further, a clearance in the protective tube 151 is filled with thermal conductive cement 52. In particular, in the case where a resistance heating element is divisionally controlled, precise temperature control of the plate 40 cannot be achieved unless measurement variations as well as precise measurement are controlled. Therefore, applying such a fitting structure was considered to be preferred.

JP-A-4-98784 discloses that, in a wafer heating apparatus wherein a single resistance heating element is buried in a ceramic plate, temperature-measuring points are positioned on the wafer heating surface of the ceramic plate at a distance of about $1/\sqrt{2}$ times a radius of a wafer heating region on the ceramic plate from the center of the wafer heating region in order to prevent the temperatures on a heating region for heating the wafer from deviating from an optimal value.

JP-A-2001-85144 discloses a wafer heating apparatus 21 as shown in FIG. 9 wherein, as a temperature sensor, a thermocouple with a wire size of less than 0.5 mm is inserted in a recess 23, having a depth of 2 mm and a diameter of 1.2 mm, formed in the ceramic plate 22 of a thickness of 3 mm, which recess is then sealed with a heat-resistant resin.

In JP-A-2002-100559 or JP-A-2001-338862, a wafer heating apparatus is described in which a recess is formed in the ceramic plate and then a temperature sensor is press-fixed with a fixing member.

However, it is required that, in a ceramic plate used for a wafer heating apparatus that processes wafers one by one, which has recently attracted public attention, its thickness is required to be reduced to 2–5 mm in order to shorten the processing time for one wafer. Thus, the processing time must be adjusted so that a cycle time for heating and cooling is shortened. However, in order to uniformly heating the whole surface of a wafer in the range of plus or minus 0.5° C., there was a problem that the object of uniformly heating the wafer cannot be achieved only by providing a temperature sensor in a ceramic plate in a conventional manner.

In the wafer heating apparatus, even if the temperature sensor 150 is disposed in a manner so as to be parallel to the mounting surface 40aof the plate 40, on which a wafer W is mounted, as disclosed in JP-A-9-45652, the plate 40 made of metal has a large thickness of 30 mm or more and thus it was not possible to raise or reduce the temperature of the plate 40 rapidly. Furthermore, heat is dissipated to the outside of the plate 40 from the body of the temperature sensor 150 or the connecting member to the temperature sensor 150, so that the temperatures of the temperature measuring portions are lowered, or the temperature sensor 150 cannot surely be thermally connected to the upper surface of the recess 41 of the plate 40. Therefore, there was a problem that the temperatures of the plate 40 and the wafer W cannot accurately be measured.

The temperature of the wafer W has poor responsiveness to the temperature set depending on the distance from the resistance heating element fitted to the plate 40 or the distance from the mounting surface 40a to the temperature sensor 150 and thus the temperature varies, and it takes a long time to control the Wafer W at a uniform temperature. Thus, there was a problem that the processing time for the wafer increased.

Furthermore, a wafer heating apparatus wherein a thermocouple is connected to the ceramic plate described in the above JP-A-2002-100559 and JP-A-2001-338862 is easily affected by noise due to a change in the outside temperature and so on and thus there was difficulty in controlling the wafer W into an extremely uniform temperature for example, within a temperature difference of less than 0.1° C.

SUMMARY OF THE INVENTION

In view of the above problem, according to the present invention, a wafer heating apparatus including: a ceramic plate having a front surface of the ceramic plate serving as a mounting surface for mounting a wafer and a recess formed in the ceramic plate opening to a rear surface of the ceramic plate; a resistance heating element attached on the rear surface of the ceramic plate or buried within the ceramic plate; a recess formed in the rear surface of the ceramic plate; a temperature measuring member including a temperature sensor, leads for connecting the temperature sensor and a protective tube for covering the temperature sensor, the protective tube being inserted in the bottom side of the recess; and a filling which is inserted in the recess to hold the protective tube secured therein; wherein a length along the leads from the front end of the protective tube to a point where the leads are exposed from the end portion of the filling is set in a range of 5 to 30 times the outer diameter of the protective tube.

In the wafer heating apparatus, the shortest distance from the center of the temperature sensor to the heat resistance element may be set to satisfy the following relationship:

$$L_2 - 6 \cdot A < L_1 < L_2 - 2 \cdot A$$

where $L_1$ is the shortest distance from the center of the temperature sensor to the heat resistance element; A is the outer diameter of the protective tube; and $L_2$ is the shortest distance from an intersection at which a normal extended from the temperature sensor to the front surface of the ceramic plate intersects the front surface of the ceramic plate to the resistance heating element, The wafer heating apparatus according to present invention the filling preferably may have a thermal conductivity of 0.60 to 3.00 times that of the ceramic plate. Also, the filling comprises a metal having Vickers hardness of not more than 50.

In the wafer heating apparatus, the temperature sensor in the recess may be disposed parallel to an upper bottom surface of the recess.

The temperature sensor comprises a wire containing a major component of platinum.

DETAILED DESCRIPTION OF THE PREFERRED EMBODIMENTS

Figure 1:
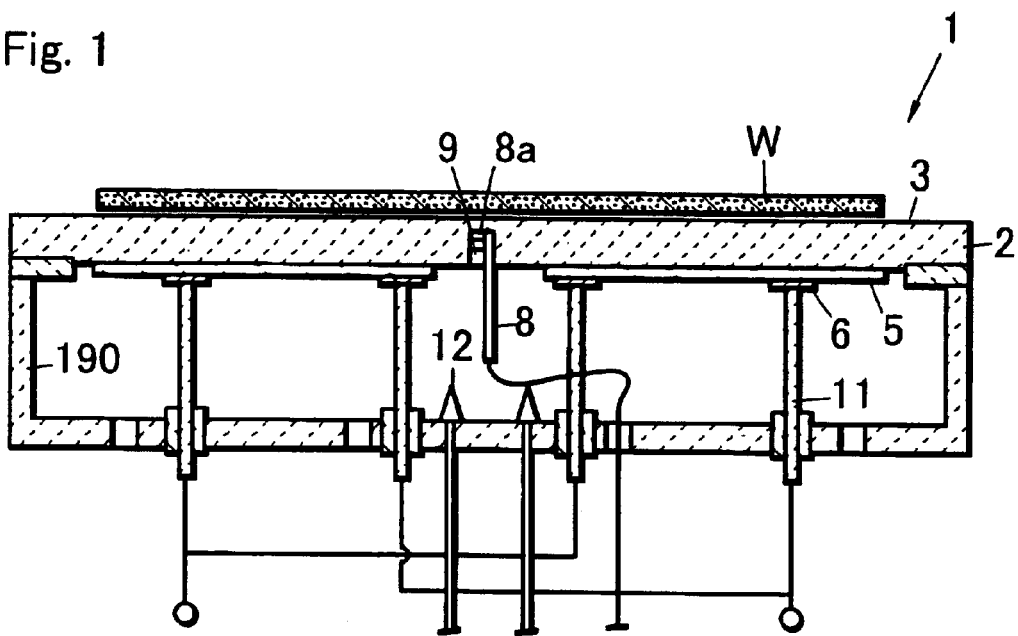
FIG. 1 is a cross sectional view showing a wafer heating apparatus of a embodiment according to the present invention.

Referring to FIG. 1, an example of wafer heating apparatus 1 includes a ceramic plate 2 mainly composed of silicon carbide, alumina or aluminum nitride, a front surface 3, one of major surfaces of which serves as a mounting surface of a wafer W, a rear surface, the other of the major surfaces of which is formed with a resistance heating element 5, the resistance heating element 5 having a power-supply portion electrically connected to power supplying elements 11.

The wafer heating apparatus 1 is so constructed that a temperature raised by the resistance heating element 5 is measured by a temperature sensor 8a fixed to a recess 9 of the ceramic plate 2.

The wafer heating apparatus 1 has a lift pin 12 which may move the wafer W up and down via a hole formed through the ceramic plate 2, whereby the wafer W can be lowered onto, and lifted from, the front surface 3. Power supplying terminals 11 are connected to the power-supply portion 6, power is supplied from the outside and the wafer W can be heated while measuring the temperature by a temperature measuring member including: the temperature sensor 8a; leads 8 coupled to the temperature sensor 8a; and a protective tube 10 in which the temperature sensor 8a is inserted.

Figure 2:
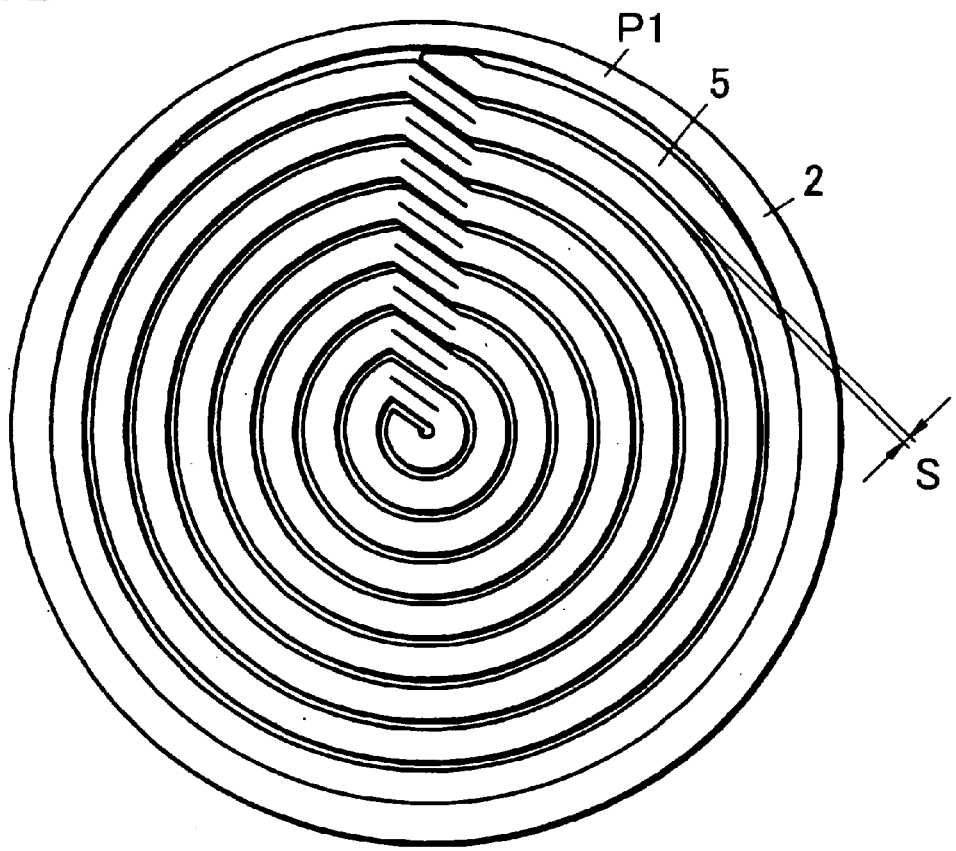
FIG. 2 is a schematic view showing a pattern of resistance heating element on or within in the wafer heating apparatus of the present invention.
Figure 3:
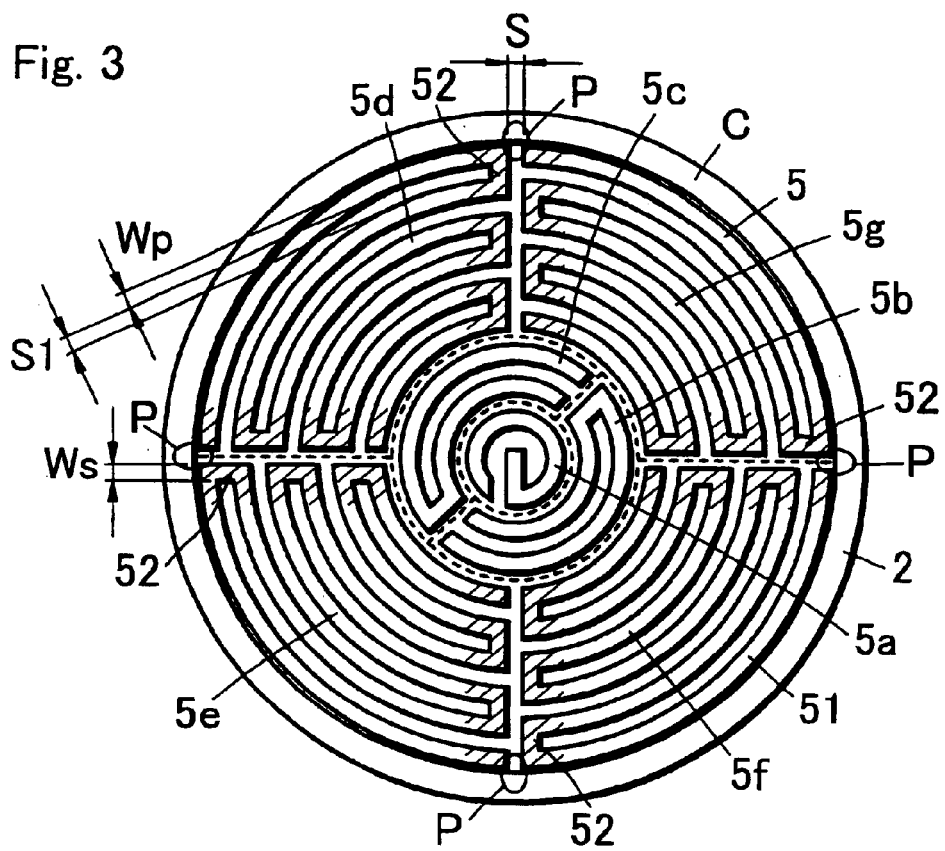
FIG. 3 is a schematic view showing another pattern of resistance heating element in the wafer heating apparatus of the present invention.
Figure 4:
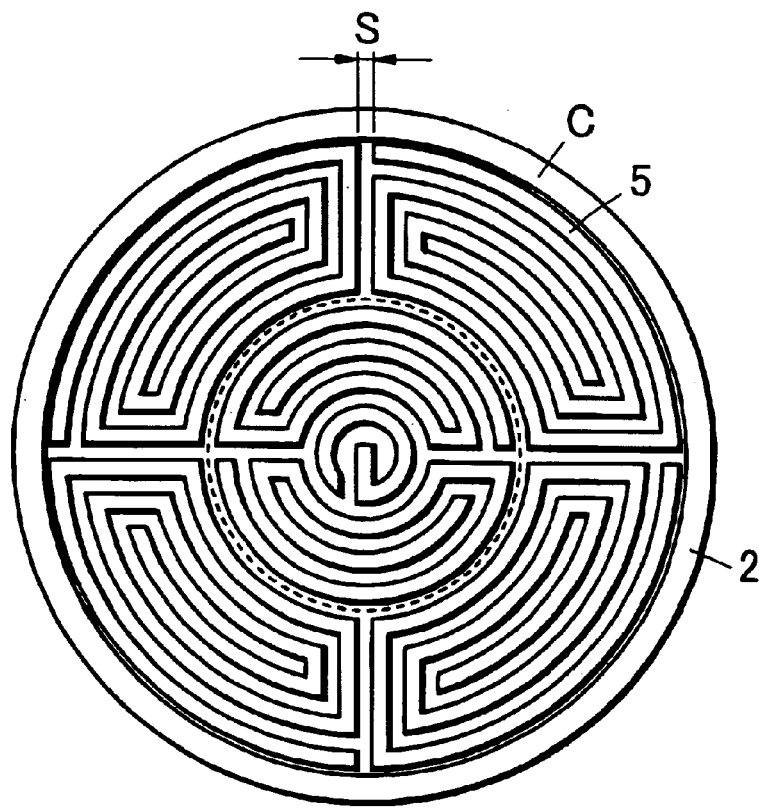
FIG. 4 is a schematic view showing further another pattern of resistance heating element in the wafer heating apparatus of the present invention.

Examples of patterns of the resistance heating element 5 include a swirl-shaped pattern as shown in FIG. 2, or a pattern with swirl-shaped portions and zigzag-shaped portions, which is divided into a plurality of blocks, each block consisting of an arc-shaped pattern and a linear pattern as shown in FIGS. 3 and 4. In the case where the resistance heating element 5 is divided into a plurality of blocks, the temperature of each block is independently measured and controlled so that the wafer W on the front surface 3 can uniformly be heated.

The resistance heating element 5 is obtained by printing a paste composed of conductive metal particles containing glass frit or metal oxide on the ceramic plate 2 by printing. The conductive metal particles may include a component containing at least one of Au, Ag, Cu, Pd, Pt, Rh, and the like. Preferably, the glass frit may be composed of an oxide containing B, Si, Zn or the like. By preparing the resistance heating element 5 of glass or metal oxide contained in metal particles, the thermal expansion coefficient of the resistance heat element 5 can be made closer to that of the ceramic plate 2.

Figure 5:
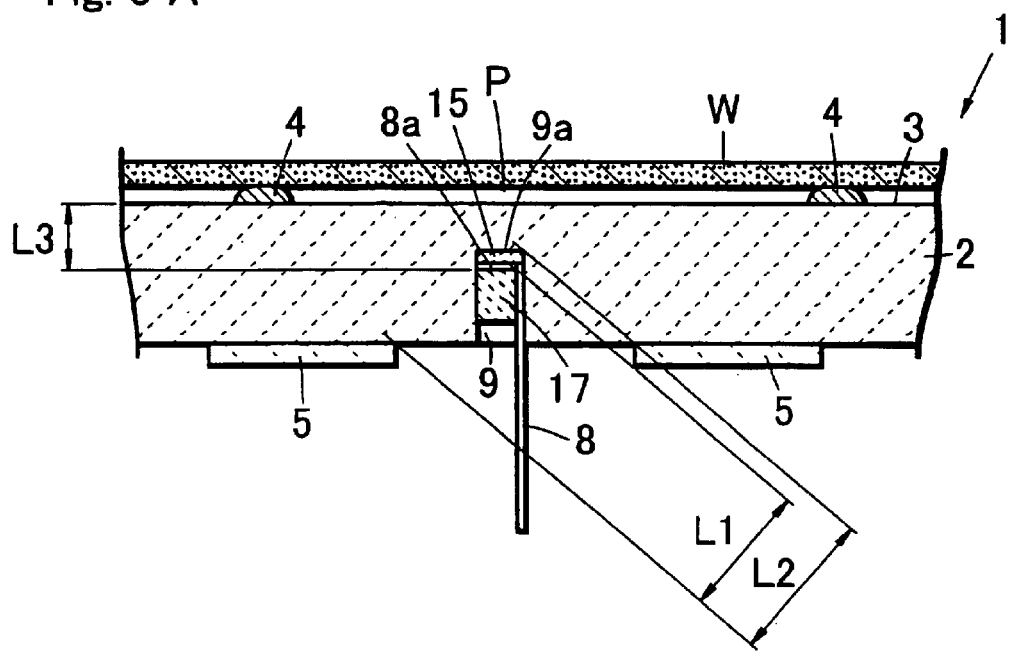
FIG. 5A is an enlarged cross sectional view showing a fitting portion of a temperature sensor in the wafer heating apparatus of an embodiment.
FIG. 5B is an further enlarged view of the fitting portion thereof as shown in FIG. 5A.
Figure 5:
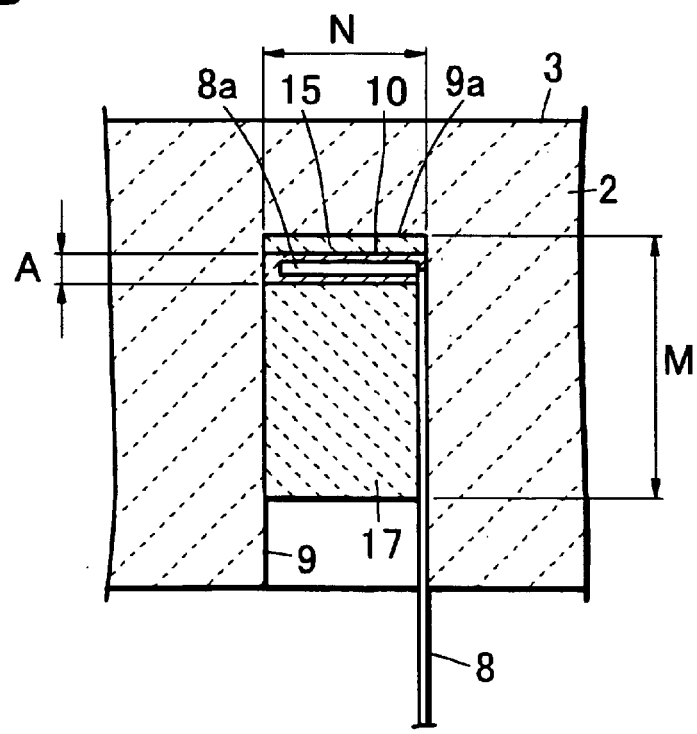

As shown in FIG. 5, the front surface 3 may also be provided with a plurality of support pins 4 so that the wafer W is supported at a fixed distance from the front surface 3 of the ceramic plate 2.

In the wafer heating apparatus 1 of the present invention, the recess 9 is formed in the rear surface opposite from the front surface 3 of the ceramic plate 2, on which the wafer W is mounted or which supports the wafer W at a fixed distance. Then, the temperature sensor 8a covered with the protective tube 10 and the leads 8 are inserted in the recess 9 to measure the temperature of the ceramic plate 2. The recess 9 has a diameter N of 2–5 mm, and the ceramic plate 2 is bored to a thickness of two thirds of a preferred thickness of 2–5 mm of the ceramic plate 2. It is preferred that the protective tube 10 covering the temperature sensor 8a be contacted with an upper surface 9a of the recess 9 directly or through a highly thermally conductive member 15 made of an easily deforming metal foil or paste having a high thermal conductivity of 100 W/(m·K) or more to be thermally connected to the upper surface 9a of the recess 9 in a manner such that the temperature of the front surface 3 of the ceramic plate 2 is accurately reflected and that the thermal resistance of the contact interface between the temperature sensor 8a and the upper surface 9a of the recess 9 is reduced.

As a temperature detecting element of the present invention, the temperature sensor 8a formed of a platinum made temperature measuring resistor is used and thus the variation in temperature is in the small range of plus or minus 0.01° C. This has proven to be far better than the variation in the range of plus or minus 0.03° C. in the case where a conventional thermocouple is used.

In the wafer heating apparatus 1 of the present invention, a length along the leads 8 from the front of the protective tube 10 to a position where the leads 8 are exposed from filling 17 is set to 5 to 30 times the outer diameter A of the protective tube 10. The length along the leads 8 from the front of the protective tube 10 to the position where the leads 8 are exposed from the filling 17 means the length M+N shown in FIG. 5B.

That is, in order to accurately measure the temperature of the front surface 3 of the ceramic plate 2 with a thickness of 2 to 5 mm, it is required to transmit the temperature of the front surface 3 of the ceramic plate 2 to the temperature sensor 8a. If the recess 9 is in thermal contact with the temperature sensor 8a or the leads extending over a length of five times or more of the outer diameter of the protective tube 10 from the center of the temperature sensor 8a, the temperature of the front surface 3 can accurately be measured with high sensitivity.

At this time, if the length (M+N) along the leads 8 from the front of the protective tube 10 to the position where the leads 8 are exposed from the filling 17 is less than five times the outer diameter of the protective tube 10, the heat in the temperature sensor 8a leaks from the ceramic plate 2 through the protective tube 10 covering the temperature sensor 8a or through the leads 8. Thus, there is fear that the temperature of a temperature measuring point may be lowered.

Therefore, the length thereof is preferably seven times or more, and more preferably 10 times or more and most preferably 16 times or more. In particular, it is preferred that the temperature sensor 8a be placed at the upper surface 9a of the recess 9. Furthermore, by making the linear portion parallel to the upper surface 9a of the recess 9, the temperature of the front surface 3 can be measured with high sensitivity, which is preferred. It is more preferred if the linear portion be parallel to the front surface of the ceramic plate 2.

Further, it is important that the filling 17 for fixing the protective tube 10 covering the temperature sensor 8a and leads 8 extending from the temperature sensor 8a is provided in the recess 9 and that, in the recess 9, the length (M+N) of the protective tube 10 covering the temperature sensor 8a and part of the leads 8, which are covered with or interposed in the filling 17, is not more than 30 times the outer diameter A of the protective tube 10.

If the length (M+N) exceeds 30 times the outer diameter A of the protective tube 10 by enlarging the recess 9 for fixing the protective tube 10 that covers the temperature sensor 8a, or by coiling the protective tube 10, the length of the protective tube 10 within the recess 9 increases and therefore there is fear that the temperature distribution of the front surface 3 of the ceramic plate 2 may change due to differences in the thermal conductivity and the thermal capacity between the thin ceramic plate 2 with a thickness of 2–5 mm and the protective tube 10.

Preferably, the length (M+N) of the protective tube 10 covering the temperature sensor 8a and the leads 8, which are covered with or interposed in the filling 17, is not more than 20 times the outer diameter of the protective tube 10. Setting the length (M+N) as above makes it possible to suppress a temperature difference between the temperature sensor 8a and the ceramic plate 2 within 0.3° C., and moreover possible to improve responsiveness to a change in the temperature of the front surface 3.

Further, in the case where the protective tube 10 covering the temperature sensor 8a is fixed with a brazing material or a thermally conductive paste as the filling 17, a thermally connecting portion to the recess 9 means a portion where the protective tube 10 covering the temperature sensor 8a is covered with the brazing material or the thermally conductive paste.

In the case where a solid material is used as the filling 17, the thermally connecting portion indicates a portion where the filling 17 in the recess 9 is in contact with the protective tube 10 that covers the temperature sensor 8a and the leads 8 extending from the temperature sensor 8a.

Furthermore, in the case where the solid filling 17 is used, because the protective tube 10 is not buried in the filling 17, there is an influence of atmospheric gas; however, in the wafer heating apparatus 1 for a coating developer, there is no influence of atmospheric gas, which is preferred in view of handling.

In particular, in the case where the filling shown in FIG. 5 is solid, for securing the thermal connection between the protective tube 10 covering the temperature sensor 8a and the recess 9 made of ceramic, it is preferred that a soft metallic foil such as an aluminum foil be placed as the thermally conductive member 15 and the protective tube 10 covering the temperature sensor 8a be pressed against the filling 17 through the thermally conductive member 15 so that the protective tube 10 is in face contact with the recess 9.

The recess 9 is made of the ceramic plate 2, with high rigidity, having Young's modulus of 200 GPa or more. Since the upper surface 9a of the recess 9 has a small deformation due to application of pressure, preferably the upper surface 9a of the recess 9 may be brought into face contact with the thermally conductive member 15 which may be brought into face contact with the protective tube 10 covering the temperature sensor 8a in order to thermally contact the protective tube 10 covering the temperature sensor 8a with the recess 9. Usually, it is difficult to for the protective tube 10 to be made into direct contact with the upper surface 9a of the recess directly, because the upper surface 9a of the recess made of ceramic has only a low deformability; thus, an adequate force may be applied to the protective tube 10, in which the temperature sensor 8a is inserted, with respect to the upper face of the recess by means of the thermally conductive member 15 made of metal foil such as aluminum or silver which is largely deformable and which is easily brought into face contact with the protective tube 10.

This is effective for reducing the thermal resistance at an interface between the recess 9 and the protective tube 10 covering the temperature sensor 8a, and is also useful in measuring the accurate temperature of the front surface 3. Preferably the protective tube 10 may be formed of stainless steels SUS 304 and SUS 316, both according to JIS, titanium and its alloy and the like. The protective tube 10 may be doubled in which case the outer shape of the protective tube 10 is important.

Next, as described above, the temperature of the front surface 3 of the wafer heating apparatus 1 can accurately be measured by disposing the protective tube 10 covering the temperature sensor 8a and the leads 8. In order to control the wafer W at a uniform temperature, power is supplied to the resistance heating element 5 provided on the ceramic plate 2 to generate heat, while measuring the temperature of the front surface of the ceramic plate 2 with the temperature sensor 8a. In order to achieve this, thermal conduction from the resistance heating element 5 to the ceramic plate 2, and heat transfer from the front surface 3 of the ceramic plate 2 to the temperature sensor 8a, heat transfer from the resistance heating element 5 to the temperature sensor 8a are particularly important. It is required that the heat in the resistance heating element 5 be transferred to the front surface 3 and that the temperature distribution in the wafer W be uniform.

However, if the temperature sensor 8a is heated later than the front surface 3 by the heat generated in the resistance heating element 5, it becomes difficult to measure the temperature of the front surface 3 accurately and responsively. In view of this, it is preferred that the shortest distance $L_1$ from the center of the temperature sensor 8a to the resistance heating element 5 and the shortest distance $L_2$ from an intersection P between a perpendicular extended from the temperature sensor 8a to the front surface 3 of the ceramic plate 2 and the front surface 3 to the resistance heating element 5 be equal and that the thermal resistance of a space in each shortest distance be small as much as possible. Then, the present inventor has found that, in accordance with the outer diameter A of the protective tube 10, if the distances $L_1$, $L_2$ satisfy the relationship represented by the following formula: $L_2-6 \cdot A < L_1 < L_2-2 \cdot A$ a wafer heating apparatus 1 in which the temperature distribution of the wafer W is uniform and which-enables prompt and simple temperature changes can be provided.

The reason for that is as follows. If $L_1$ is greater than $L_2-2 \cdot A$, because the temperature sensor 8a is too close to the front surface 3, the temperature of a portion in the front surface 3, which is close to the temperature sensor 8a, is lowered and the temperature distribution of the wafer W deteriorates. There is also fear that the temperature representing that of the front surface cannot be measured. On the other hand, if $L_1$ is smaller than $(L_2-6 \cdot A)$, the temperature sensor 8a is affected by the temperature of the resistance heating element 5 more than by the front surface 3 and thus it becomes difficult to measure the temperature of the front surface 3 accurately and promptly with the temperature sensor 8a.

This not only makes it impossible to control the wafer W at a uniform temperature or impossible to control the wafer to a set temperature when the wafer W is rapidly heated, but also increases the possibility that an overshoot in the temperature of the wafer W is caused.

It is preferred that the thermally conductive member 15 and the filling 17 for fixing the protective tube 10 in the recess 9 may have a thermal conductivity of 100 W/m/K or more and that they may have a thermal conductivity of more than 60% but less than 300% of that of the ceramic plate 2. If the thermally conductive member 15 and the filling 17 have a thermal conductivity of less than 100 W/m/K, or less than 60% of that of the ceramic plate 2, the temperature of the front surface 3 of the ceramic plate 2 is not promptly transmitted to the temperature sensor 8a.

Thus, there is fear that it becomes difficult to control the temperature of the wafer W accurately and promptly. On the other hand, if the thermally conductive member 15 and the filling 17 have a thermal conductivity of 300% or more of that of the ceramic plate 2, because a difference in thermal conductivity between the ceramic plate 2 and both the thermal conductive member 15 and the filling 17, hot spots or cool spots occur on the front surface 3 above the recess 9 when the temperature sensor 8a, the thermally conductive member 15 and the filling 17 are filled in the recess 9. This results in poor temperature distribution of the wafer W, which is not preferred.

Furthermore, it is preferred that the thermally conductive member 15 have a Vickers hardness Hv measured by applying a load of 1N of not more than Hv 50. If the hardness thereof is more than Hv 50, a contact area of the protective tube 10 covering the temperature sensor 8a to the thermally conductive member 15, and another contact area of the thermally conductive member 15 to the upper surface 9a of the recess 9 are both small so that a prompt measurement of temperatures is difficult to be made on the front surface 3 of the ceramic plate 2. Consequently, in the process where the wafer temperature is raised rapidly or thereafter controlled uniformly on the surface, an overshoot in temperature may be sometimes caused. Therefore, the hardness of the thermally conductive member 15 is preferably not more than Hv 50, and more preferably not more than Hv 30.

Preferred examples of the thermally conductive member 15 include silver, aluminum, platinum and gold. The thickness of the thermally conductive member 15 may be in a range of 10 to 300 μm. If the thickness of the thermally conductive member 15 is less than 10 μm, an area of the thermally conductive member 15 that is in face contact with the protective tube 10 is small even when the protective tube 10 is pressed against the thermally conductive member 15. If the thickness of the thermally conductive member 15 is more than 300 μm, the heat transfer rate decreases down to a level of making it difficult to carry out prompt temperature measurement. The thickness of the thermally conductive member 15 is preferably in the range of 50 to 200 μm.

It is preferred that the front of the protective tube 10 covering the temperature sensor 8a and the leads 8 be disposed on the upper surface 9a of the recess 9 in such a manner as to be parallel to the front surface 3. If the front of the temperature sensor 8a and the leads 8 is not disposed parallel to the front surface 3, the heat in the temperature sensor 8a travels through the leads 8 and the protective tube 10, dissipating from the temperature sensor 8a. Therefore, the output temperature measured is so lowered compared to a true temperature value that accurate measurement of the wafer temperature cannot be achieved. The length of the temperature sensor 8a that is parallel to the front surface 3 is preferably 2 to 5 mm.

If the length thereof is less than 2 mm, because a detecting portion of the temperature measuring portion is short, heat dissipation is great, which makes it difficult to measure the temperature accurately. If the length thereof is more than 5 mm, the inner diameter of the recess increases too much and thus there is fear that cool spots occur on the upper surface of the recess.

Figure 6:
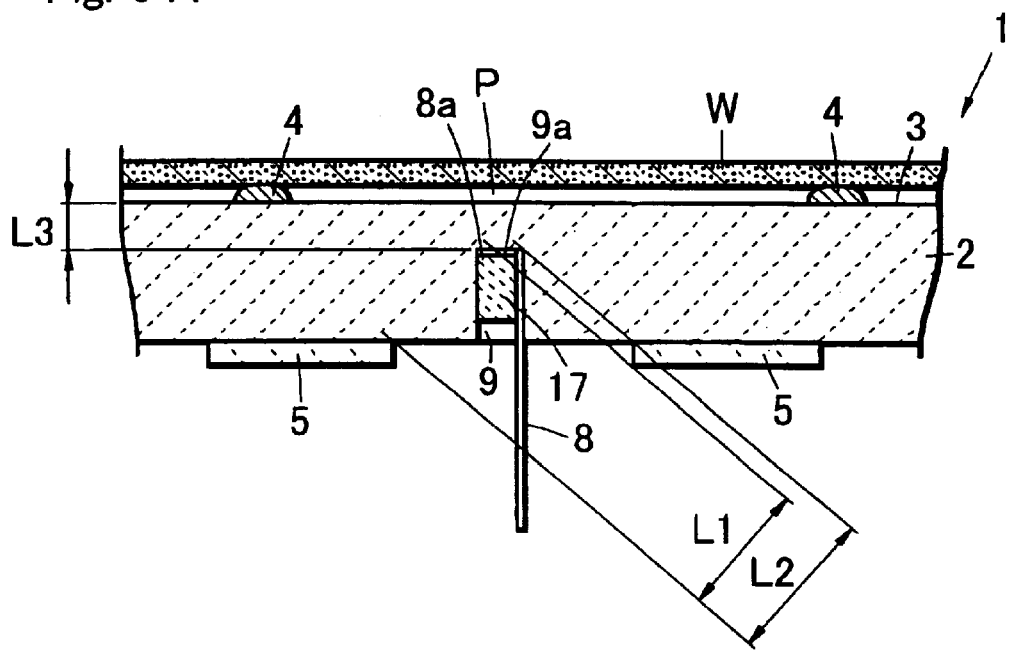
FIG. 6A is a cross sectional view showing a fitting portion of a temperature sensor in another wafer heating apparatus of the present invention.
FIG. 6B is an enlarged view of the fitting portion as shown in FIG. 6A.
Figure 6:
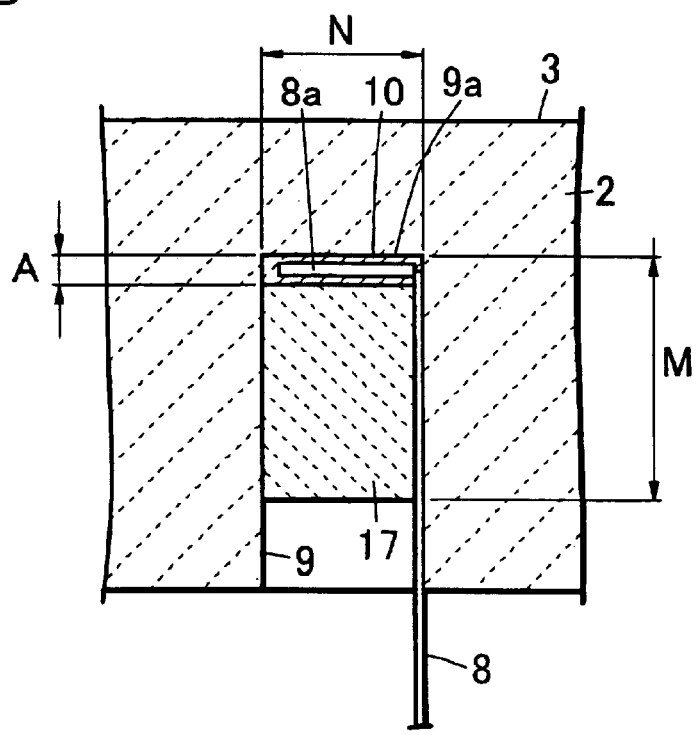

Next, another embodiment of the present invention is shown. FIG. 6 is a cross section showing another embodiment of the present invention in which a protective tube 10 covering a temperature sensor 8a is fitted to a ceramic plate 2 with a thickness of 2–5 mm, which is easily heated by the resistance heating element 5, and which has a small deformation by heating. A recess has a depth of about two thirds of the thickness of the ceramic plate 2 and has a diameter of 3 mm. The temperature sensor 8a having a small diameter of 0.5 mm and a length of 3 mm is fitted into the protective tube 10 having a diameter of 4 mm and a length of 4 mm with a thermally conductive resin, and three leads 8 with a diameter of 0.2 mm are taken out and the protective tube 10 is fixed to the recess 9 with filling 17.

Besides the filling, for example, gold tin braze and silver copper braze can be used for the above fixing. In addition to the brazing materials, the protective tube 10 may be bonded to the recess 9 with a thermally conductive paste with very small hardening shrinkage, in which silver and epoxy resin, for example, are mixed. It was found that, if the brazing material and the thermally conductive paste have the same thermal characteristics as those of the ceramic plate 2, the temperature of the wafer W can be measured accurately with high sensitivity.

Figure 7:
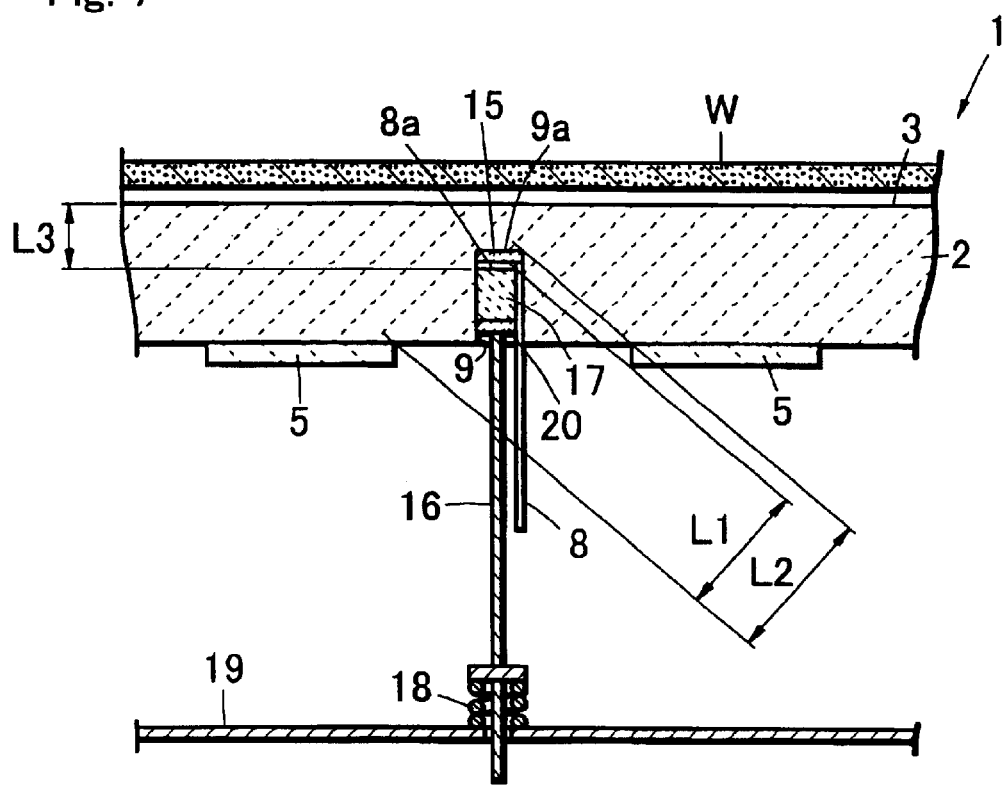
FIG. 7 is a cross sectional view showing a fitting portion of another temperature sensor in the wafer heating apparatus of an embodiment according to the present invention.
Figure 8:
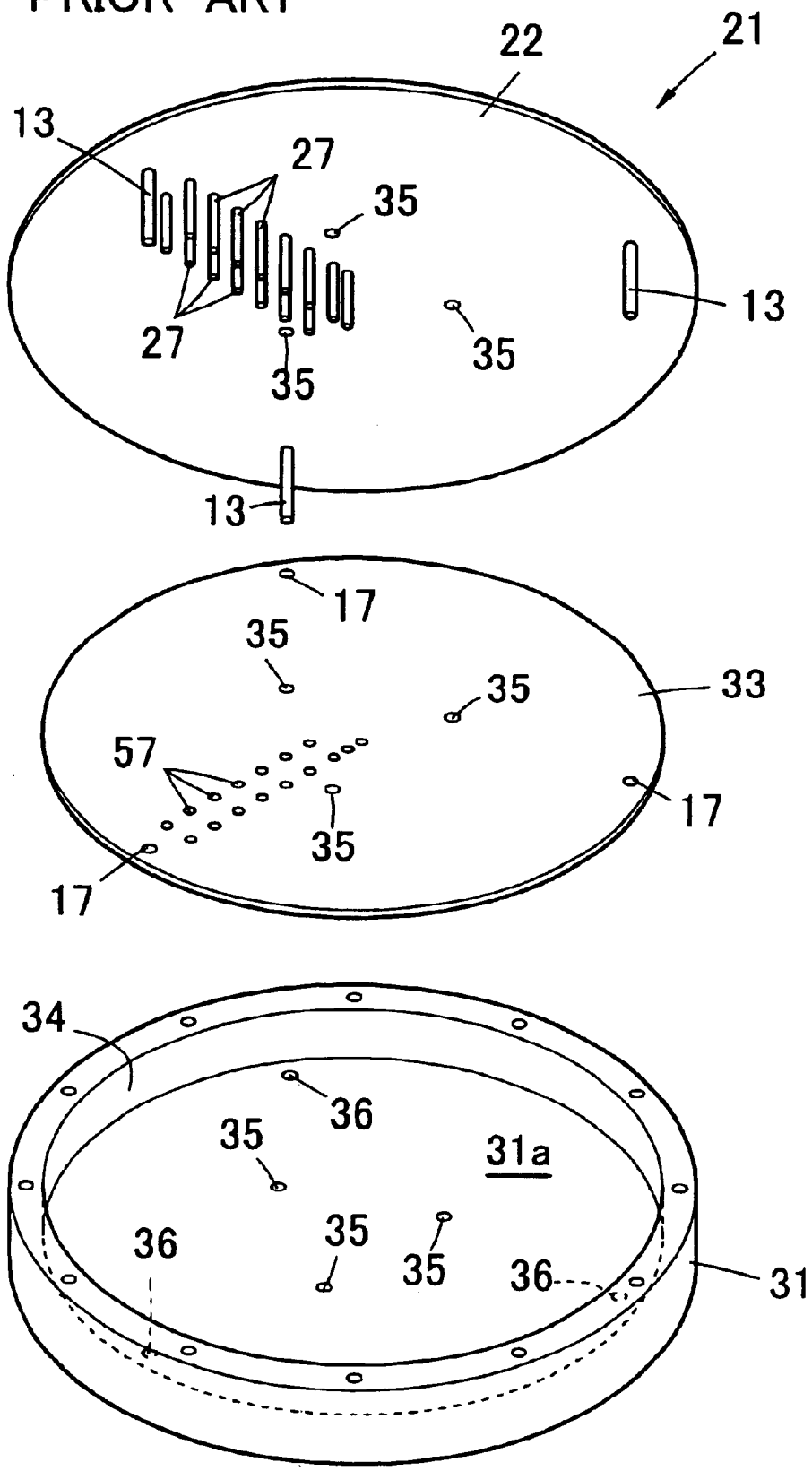
FIG. 8 is an exploded, perspective, view showing a conventional wafer heating apparatus.
Figure 9:
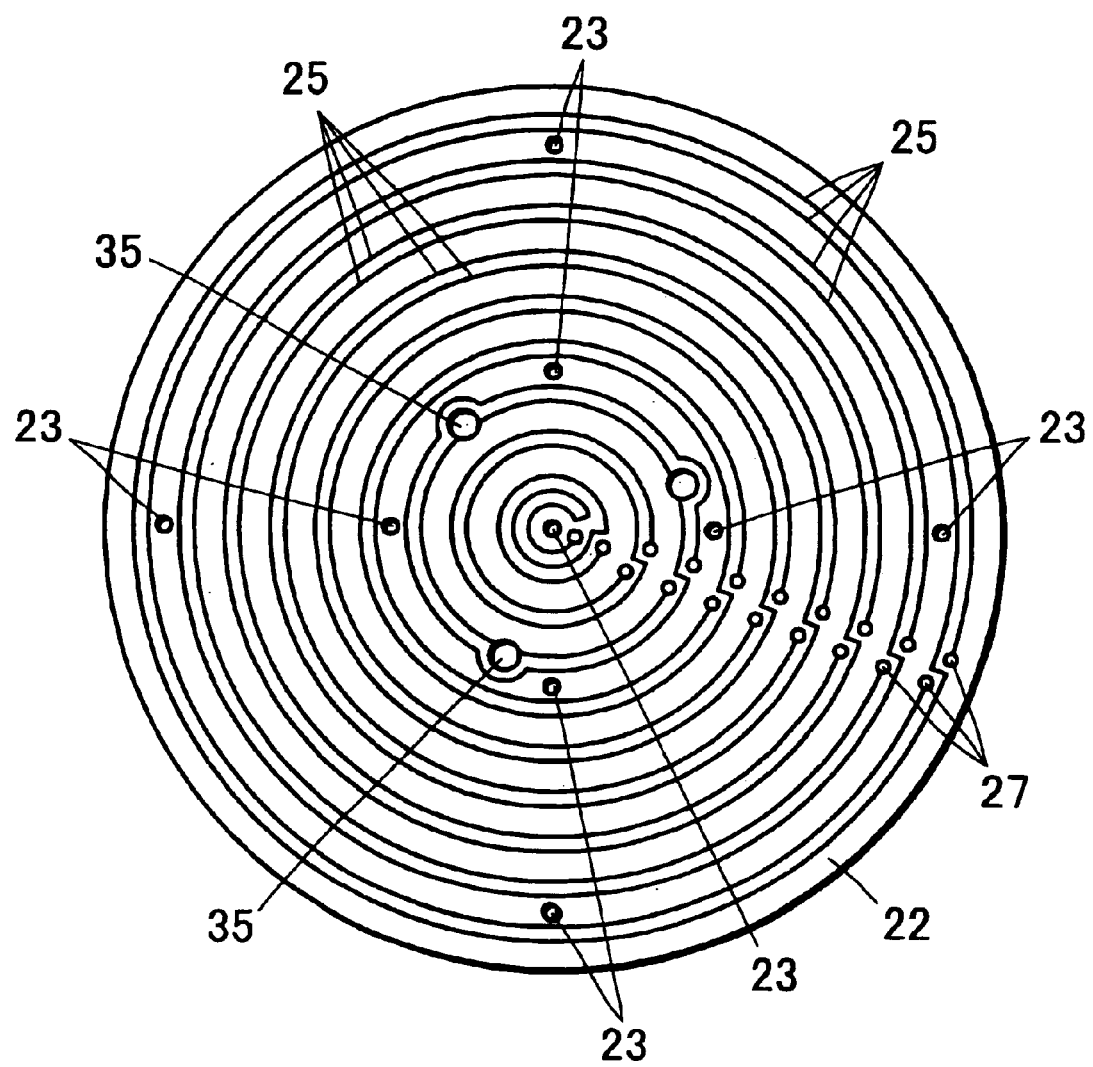
FIG. 9 is a schematic view showing a resistance heating element of a conventional wafer heating apparatus.
Figure 10:
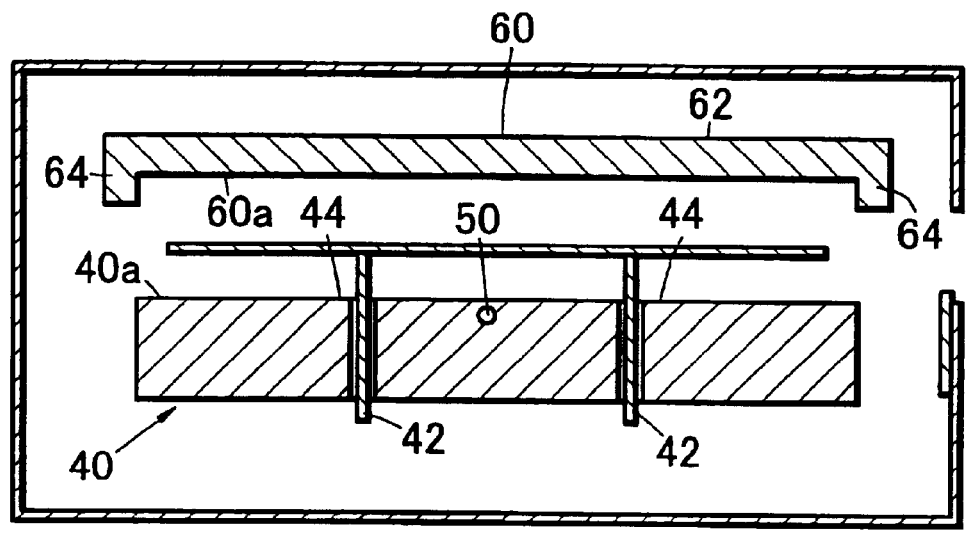
FIGS. 10A and 10B are schematic views each showing a fitting portion of a temperature sensor in a conventional wafer heating apparatus.
Figure 10:
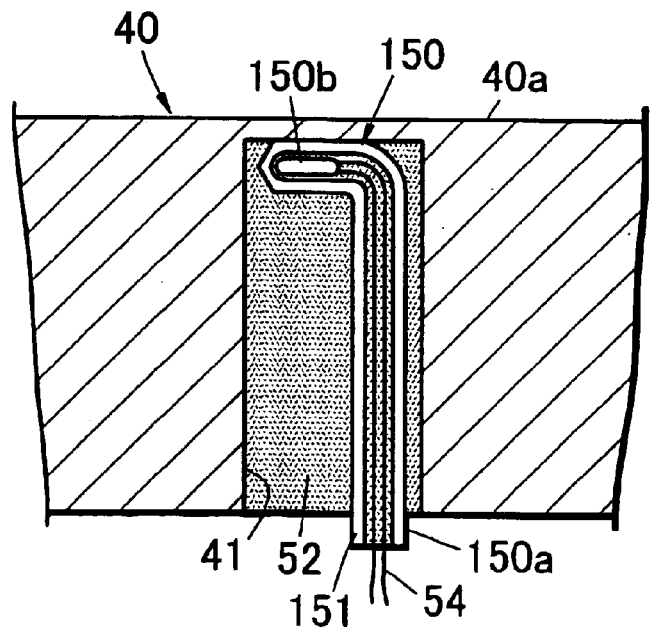

In FIG. 7, a similar recess 9 is formed in a ceramic plate 2 similar to that shown in FIG. 6, the thermally conductive member 15 is provided on an upper surface 9a of the recess, and the protective tube 10 covering the temperature sensor 8a and the leads 8 is pressed with the filling 17. A pressing pin 16 for pressing the filling 17 is equipped. As a heat insulating layer, a heat insulating member 20 made of a heat-resistant resin such as alumina-zirconia composite ceramic or Tefron (R) having a thermal conductivity of not more than 5 W/m/K is used between the pressing pin 16 and the filling 17. The pressing pin 16 has a structure of pressing the heat insulating member 20 with spring coils 18 provided outside.

On the other hand, the material usable for the ceramic plate 2 that constitutes the wafer heating apparatus 1 includes alumina, silicon nitride, SIALON, aluminum nitride and silicon carbide, which are superior in abrasion resistance and thermal resistance. Among them, the thermal conductivities of aluminum nitride and silicon carbide are 50 W/m/K or more and 100 W/m/K or more, respectively, and the Young's moduluses of thereof are as high as 300 GPa and 400 GPa, respectively.

Therefore, these ceramic plate materials are preferred for the ceramic plate 2, since the deformability of a plate during heating is relatively small. They have high corrosion resistance to corrosive gas such as fluorine-based or chlorine-based gases, and have heat-corrosive resistance to plasma.

As a method of producing such a wafer heating apparatus 1, first, a sintering aid is added to AlN powder constituting a ceramic plate 2 and an acrylic binder is added thereto. The resultant mixture is molded into a plate shape. The resultant molded product in which residual carbon remains is high-pressure sintered at about 2000° C. Alternatively, 0.1 wt % calcia is added to AlN powder with a binder added thereto followed by granulation.

The resultant powder is molded into a plate shape and then sintered at 2000° C. or higher in a nitrogen atmosphere. Front and rear surfaces of the sintered ceramic plate 2 are ground to give a disc shape. Subsequently, a resistance heating element 5 is formed on a rear surface by printing. Examples of the resistance heating element 5 provided on the ceramic plate 2 include the one provided with a swirl-shaped resistance heating element 5 that is present from its roughly circular-shaped center toward its outer circumference as shown in FIG. 2, or the one provided with a resistance heating element 5 as shown in FIGS. 3 and 4.

Thereafter, a front surface 3 of the ceramic plate 2 is polished and a wafer W is placed thereon. Alternatively, the wafer W is supported at a fixed distance from the front surface 3 and power-supplying terminals 11 and the ceramic plate 2 are fixed to a bottomed cylindrical member 19.

In FIG. 1, the wafer heating apparatus 1 wherein only the resistance heating apparatus 5 was provided on the rear surface of the ceramic plate 2 was described. It is a matter of course that, in the present invention, electrodes for adsorption of static electricity or generation of plasma may be buried between the front surface 3 and the resistance heating element 5. Furthermore, although the heater as the resistance heating element 5 was provided on the rear surface of the ceramic plate 2 was described, the same effect can be obtained even if the resistance heating element 5 formed on the rear surface of the ceramic plate 2 is covered with a glass material and so on.

Although the embodiment in which the resistance heating element 5 was provided on the front surface 3 of the ceramic plate 2 was described, the same effect can be obtained by a wafer heating apparatus wherein the resistance heating element 5 is buried in the rear surface of the ceramic plate 2.

EXAMPLES

Example 1

As a ceramic plate 2, aluminum nitride powder with an average particle diameter of 1.2 $\mu$m and 0.1 wt % calcia with an average particle diameter of 1 $\mu$m were mixed and pulverized. Then an acrylic binder was added thereto. The resultant product was molded into a disc-shaped plate with a diameter of 400 mm. The disc-shaped plate was debinded at 400° C. for one hour in air and in a nitrogen atmosphere, and was then sintered at 2000° C. in a nitrogen atmosphere. Upper and lower surfaces were ground to obtain disc-shaped ceramic plates having a diameter of 320 mm and a thickness of 3 mm. Subsequently, a paste for coating the rear surface was prepared by adding a solvent to powder containing 50 wt % metal silver and 50 wt % $B_2O_3.SiO_2.ZnO$ glass (thermal expansion coefficient: $4\times10^{-6}$/° C.).

Then, as a resistance heating element, the paste was coated to a thickness of 20 $\mu$m on the rear surface of the ceramic plate by screen printing. A recess 9 with a diameter of 3 mm and a depth of 2 mm was formed in each resistance heating element. Thereafter, a 100-μm thick aluminum foil as a thermally conductive member was placed on an upper surface of the recess, and a temperature sensor formed of a temperature measuring resistor was inserted in a protective tube made of SUS304 and having an outer diameter of 0.5 mm. Then, three leads were coiled in a swirl shape, their front portions were placed on the aluminum foil, and the protective tube 10 and leads 8 were fixed to aluminum-made filling having a diameter of 3.9 mm, a thickness of 2 mm and formed with a groove through which the protective tube 10 and the leads 8 were passed.

The filling was pressed by a pressing pin through a heat insulating member having an outer diameter of 3.9 mm, a thickness of 500 μm and made of zirconia ceramic, so that the filling was thermally connected to the upper surface of the recess. In the thermal connection, the length along the leads from the front of the protective tube covered with or interposed in the filling to a point where the leads were exposed from the filling was adjusted by the length of the three leads that were bound up into a bundle.

In sample No. 7, filling made of silver copper braze was heated to 350° C. to be press-fitted.

Wafer heating apparatuses were prepared. In the wafer heating appratuses, the protective tube was covered with or interposed in the filling. Also, the length along the leads covered with or interposed in the filling from the front of the protective tube covering the temperature sensor, which was formed of a platinum made temperature measuring resistor, to a point where the leads were exposed from the filling was changed. Each of the wafer heating apparatuses was fitted with a power source. The temperature of a wafer W was raised from 25° C. to 200° C. in 5 minutes.

After setting the temperature of the wafer W to 200° C., the time that was taken until the average temperature of measuring points in the wafer W became uniform in the range of plus or minus 0.5° C. from 200° C. was measured as a response time. Further, a difference between maximum and minimum values among the measured temperatures in the wafer W 30 minutes after the temperature of the wafer was set to 200° C. was measured as the temperature difference in the wafer W. Then, the results shown in Table 1 were obtained.

TABLE 1

| No. | Length from end of tube to filling (M + N) | Outer diameter (A) of protective tube | (M + N)/A | Response time (sec.) | Temp. difference (° C.) |
|---|---|---|---|---|---|
| 1 | 2 | 0.5 | 4 | 62 | 1.23 |
| 2 | 2.5 | 0.5 | 5 | 51 | 0.81 |
| 3 | 3.5 | 0.5 | 7 | 43 | 0.43 |
| 4 | 5 | 0.5 | 10 | 42 | 0.43 |
| 5 | 8 | 0.5 | 16 | 31 | 0.37 |
| 6 | 10 | 0.5 | 20 | 32 | 0.35 |
| 7 | 15 | 0.5 | 30 | 32 | 0.63 |
| 8 | 4 | 0.3 | 13 | 33 | 0.51 |
| 9 | 9 | 0.3 | 30 | 52 | 0.67 |
| 10 | 10 | 0.3 | 33 | 63 | 1.11 |

In sample No. 1, the length along the leads interposed in the filling from the front of the protective tube to the point where the leads were exposed from the filling was four times the outer diameter of the protective tube, which was too short. Consequently, the response time was as long as 62 seconds. Furthermore, the temperature difference in the wafer was 1.23° C., which was large. Accordingly, it turned out that this sample was beyond the scope of the present invention.

On the contrary, in sample No. 10, the length along the leads interposed in the filling from the front of the protective tube to the point where the leads were exposed from the filling was 33 times the outer diameter of the protective tube, which was too long. Consequently, the response time was as long as 63 seconds. Furthermore, the temperature difference in the wafer W was as large as 1.11° C., which was found not to be preferred.

On the other hand, in sample Nos. 2–9, the length along the leads interposed in the filling 17 from the front of the protective tube 10 covering the temperature sensor 8a formed of a temperature measuring resistor to the point where the leads were exposed from the filling 17 was 5 to 30 times the outer diameter of the protective tube 10. The response time was not more than 52 seconds, which was small, in all of the samples and moreover the temperature difference in the wafer was not more than 0.81° C., which was small. This reveals that these samples show superior characteristics as the wafer heating apparatuses.

Sample No. 3 was more preferred because it had a response time of 43 seconds and a temperature difference in the wafer of 0.43° C., which was small. Samples Nos. 4–6 and 8 were most preferred because they had a response time of not more than 42 seconds and a temperature difference in the wafer W of not more than 0.51° C.

Accordingly, it was found that if the length along the leads, which was covered with or interposed in the filling 17 provided in the recess of the ceramic plate 2, from the front of the protective tube 10 to the point where the leads were exposed from the filling was 5 to 30 times the outer diameter A of the protective tube 10, high characteristics were exhibited.

Example 2

Wafer heating apparatuses 1 were prepared in the same process as in Example 1, except that a protective tube 10 having an outer diameter (A) of 0.5 mm was inserted in each recess 9 as the protective tube 10 covering a temperature sensor 8a and leads 8, and the protective tube 10 covering the temperature sensor 8a formed of a temperature measuring resistor and the leads 8 was fixed so that the structure shown in FIG. 7 was formed, and that the distance $L_1$ from the temperature sensor 8a in the recess to a resistance heating element 5 and the distance $L_2$ from a point P to the resistance heating element 5, which makes the distance between the temperature sensor 8a and a point on the upper surface shortest, were changed. In the same manner as in Example 1, the characteristics of the wafer heating apparatuses were evaluated. Incidentally, the position of the temperature sensor 8a was set based on the central point of the temperature sensor 8a.

In sample No. 25, a wafer heating apparatus was prepared by printing a resistance heating element 5 and then placing the same type of ALN sheet on the printed surface so that the resistance heating element 5 was covered with the ALN sheet. The characteristics of these wafer heating apparatuses are shown in Table 2.

TABLE 2

| No. | Outer diame. (A) | Dist $L_1$ | Dist $L_2$ | L2 − 6·A | L2 − 2·A | L1 > (L2 − 6·A) | L1 < (L2 − 6·A) | Respon time (sec.) | Temp. differ. |
|---|---|---|---|---|---|---|---|---|---|
| 21 | 0.5 | 7.5 | 7 | 4 | 6 | met | Not | 47 | 0.74 |
| 22 | 0.5 | 6 | 7 | 4 | 6 | met | Not | 36 | 0.54 |
| 23 | 0.5 | 5 | 7 | 4 | 6 | met | met | 26 | 0.33 |
| 24 | 0.5 | 4 | 7 | 4 | 6 | Not | met | 31 | 0.45 |
| 25 | 0.5 | −3 | 10 | 7 | 9 | Not | met | 45 | 0.76 |

Sample No. 23 that satisfied the requirement: $(L_2-6\cdot A) < L_1 < (L_2-2\cdot A)$ had a short response time of 26 seconds and showed a satisfactory temperature difference in the wafer of not more than 0.33° C.

In sample Nos. 21 and 22, $L_1 < (L_2-2\cdot A)$ was not satisfied. Sample Nos. 21 and 22 had long response times 47 seconds and 36 seconds, and had large temperature differences of 0.74° C. and 0.54° C., respectively.

In sample No. 25, the angle formed by the direction of the temperature sensor 8a and the front surface was 90° or more, which was large. Since the distance $L_1$ was indicated by a minus value, $L_1 > (L_2-6\cdot A)$ was not satisfied, the response time was as long as 45 seconds and the temperature difference in the wafer was as large as 0.76° C.

Example 3

As a ceramic plate 2, aluminum nitride powder with an average particle diameter of 1.2 μm, 0.1 wt % calcia with an average particle diameter of 1 μm and yttria with an average particle diameter of 1.1 μm were mixed and pulverized. Then, an acrylic binder was added thereto. The resultant product was molded into a disc-shaped plate with a diameter of 400 mm. The disc-shaped plate was debinded at 400° C. for one hour in air and in a nitrogen atmosphere, and was then sintered at 2000° C. in a nitrogen atmosphere. At the same time, test pieces for measuring thermal conductivity having a diameter of 10 mm and a thickness of 3 mm were cut.

Front and rear surfaces were ground to obtain disc-shaped ceramic plates 2 having a diameter of 320 mm and a thickness of 3 mm. Then, a paste was prepared by adding a solvent to powder containing 50 wt % metal silver and 40 wt % $B_2O_3.SiO_2.ZnO$ glass (thermal expansion coefficient: $4 \times 10^{-6}/°$ C.).

Subsequently, as a resistance heating element 5, the paste was coated to a thickness of 20 μm on the rear surface of the ceramic plate 2 by screen printing. Recesses 9 with a diameter of 3 mm and different depths were formed in correspondence with the resistance heating elements 5. Thereafter, a 100-μm thick aluminum foil as a thermally conductive member 15 was placed on an upper surface of each recess. As a protective tube covering the temperature measuring sensor 8a formed of the temperature measuring resistor, a sheath-shaped temperature sensor having outer diameters of 0.5 mm and 0.3 mm, and a length of 3 mm was placed on the aluminum foil.

Then, the protective tube 10 and leads 8 were fixed to aluminum-made filling having a diameter of 3.9 mm, a thickness of 2 mm and formed with a groove through which the protective tube 10 and the leads 8 were passed. The filling 17 pressed the protective tube 10 and the leads 8 with the pressing pin 16 through a heat insulating member 20 having an outer diameter of 3.5 mm, a thickness of 500 μm and made of zirconia ceramic, so that the filling 17 was thermally connected to the upper surface 9a of the recess 9.

Each of the wafer heating apparatuses was fitted with a power source. The temperature of the wafer W was raised from 25° C. to 200° C. in 5 minutes. After setting the temperature of the wafer W to 200° C., the time that was taken until the average temperature of measuring points in the wafer W became uniform in the range of plus or minus 0.5° C. from 200° C. was measured as a response time. Further, a difference between maximum and minimum values among the measured temperatures in the wafer W 30 minutes after the temperature of the wafer was set to 200° C. was measured as the temperature difference in the wafer W. Then, the results shown in Table 3 were obtained.

TABLE 3

| No. | ceramic plate | yttria (wt %) | Therm. conduct · B plate W/m/K | filling | Therm. conduct · C filling W/m/K | C/Bx · (%) | Respon. time (sec.) | Temp. differ. wafer (° C.) |
|---|---|---|---|---|---|---|---|---|
| 31 | AlN | 0 | 60 | Al | 205 | 341.7 | 25 | 0.76 |
| 32 | AlN | 0.5 | 80 | Ag | 402 | 502.5 | 24 | 0.81 |
| 33 | AlN | 2 | 135 | Ag | 402 | 297.8 | 21 | 0.32 |
| 34 | AlN | 5 | 150 | Ag | 402 | 268.0 | 18 | 0.24 |
| 35 | AlN | 3 | 140 | Ag—Ni | 80 | 57.1 | 32 | 0.23 |
| 36 | AlN | 0 | 60 | Ag—Ni | 100 | 166.7 | 12 | 0.45 |
| 37 | AlN | 0.5 | 80 | Ag—Ni | 135 | 168.8 | 13 | 0.46 |

Sample Nos. 33, 34, 36 and 37 having a thermal conductivity of the filling of 100 W/(m·K) or more that was 60% or more to not more than 300% of that of the ceramic plate had a response time of not more than 21 seconds, which were preferred.

Contrary to that, in sample Nos. 31 and 32 wherein the thermal conductivities of the filling were 341% and 502% of that of the ceramic plate, the temperature differences in the wafer were 0.76° C. and 0.81° C., respectively, which were large.

As shown in sample No. 35, in the case where the thermal conductivity of the filling 17 was 57%, namely, not more than 60% of that of the ceramic plate 2, the response time was 32 seconds, which was a little slow in response time.

Thus, the above results reveal that providing the recess with the temperature measuring sensor 8a formed of the temperature measuring resistor and fixing the protective tube 10 covering the temperature measuring sensor 8a and the leads 8 with the filling 17 having a thermal conductivity of 60% or more to not more than 300% of that of the ceramic plate 2 further reduces the response time, so that a wafer heating apparatus with a small temperature difference in the wafer can be obtained.

Example 4

Ceramic plates 2 were prepared in the same manner as in Example 1. Subsequently, as a paste to serve as a resistance heating element 5, several kinds of metals, and a glass component or metal oxide were mixed to prepare a paste. The paste was printed on a lower surface of each ceramic plate to prepare wafer heating apparatuses.

Then, fillings 17 for fixing the protective tube 10 covering the temperature sensor 8a formed of the temperature measuring resistor were prepared with a metal and Ag—Ni based alloys having different hardnesses. The resultant filings were individually fitted to the ceramic plates 2 having the same shape.

Each wafer heating apparatus was fitted with a power source. The temperature of the wafer W was raised from 25° C. to 200° C. in 5 minutes. The time that was taken before the average temperature of measuring points in the wafer W became uniform in the range of plus or minus 0.5° C. from 200° C. was measured as a response time. Further, a difference between maximum and minimum values among the measured temperatures in the wafer W 30 minutes after the temperature of the wafer was set to 200° C. was measured as a temperature difference in the wafer W.

In sample No. 44, after inserting the protective tube 10 covering the temperature sensor 8a in the recess 9, a brazing material was placed in the recess and then peripherally heated by laser beams, so that the brazing material was press-fitted into the recess 9. The results thereof are shown in Table 4.

TABLE 4

| No. | ceramic plate | filling | Hardness Hv | Response time (sec.) | Temp. differ. wafer (° C.) |
|---|---|---|---|---|---|
| 41 | AlN | Ag—Ni | 26 | 13 | 0.21 |
| 42 | AlN | Ag—Ni | 30 | 14 | 0.22 |
| 43 | AlN | Ag—Ni | 43 | 12 | 0.32 |
| 44 | AlN | Ag—Ni | 50 | 14 | 0.33 |
| 45 | AlN | Ni | 60 | 21 | 0.54 |

It was found that sample Nos. 41-44 had a response time of not more than 14 seconds and a temperature difference in the wafer of not more than 0.33° C., thus showing good characteristics.

Furthermore, it was found that sample Nos. 41 and 42 had a response time of not more than 14 seconds and a temperature difference in the wafer of not more than 0.22° C., thus showing better characteristics.

Accordingly, in the filling 17 for fixing the temperature sensor 8a, fixing the protective tube 10 with a material having a Vickers hardness of not more than 50 was found to be important for preparing a superior wafer heating apparatus 1.

Furthermore, as the temperature sensor, if the platinum made temperature sensor 8a is used, a precise reduction in the variation in temperature of the wafer is enabled without causing variations in measured temperatures or noise.

As described above, according to a wafer heating apparatus of the present invention, a front surface of a ceramic plate serves as a mounting surface on which a wafer is placed, and a rear surface or an inner portion of the ceramic plate is formed with a resistance heating element. A recess is formed in the rear surface of the ceramic plate. A temperature measuring member formed of a protective tube covering a temperature sensor is inserted in the recess so as to be held by filling. In the wafer heating apparatus, a length along the leads from the front of the protective tube to a point where the leads are exposed from the filling is set to 5 to 30 times an outer diameter of the protective tube. This makes it possible to measure a surface temperature of the wafer accurately and responsively. Therefore, the temperature of the wafer can rapidly be raised at a rate of 35° C./min. or more.

When the outer diameter of the protective tube is A, the shortest distance from the center of the temperature sensor to the heat resistance element is $L_1$, and the shortest distance from an intersection P between a perpendicular extended from the temperature sensor to the front surface of the ceramic plate and the front surface of the ceramic plate to the resistance heating element is $L_2$, the relationship: $L_2 - 6 \cdot A < L_1 < L_2 - 2 \cdot A$.

is satisfied. This makes it possible to reduce a response time as well as possible to reduce a temperature difference in the surface of the wafer of not more than 0.4° C.

Furthermore, the thermal conductivity of the filling is set to 60% or more, but not more than 300% of that of the ceramic plate and the filling is composed of a metal having a Vickers hardness of not more than 50, whereby the response time of the wafer can be reduced to not more than 33 seconds and the temperature difference in the surface of the wafer can be reduced to 0.3 to 0.8° C.

The temperature sensor of the temperature measuring member is disposed parallel to the upper surface of the recess whereby the surface temperature of the wafer can be measured more accurately and responsively.

What is claimed is:

1. A wafer heating apparatus comprising: a ceramic plate having a front surface of the ceramic plate serving as a mounting surface for mounting a wafer and a recess formed in the ceramic plate opening to a rear surface of the ceramic plate;

a resistance heating element attached on the rear surface of the ceramic plate or buried within the ceramic plate;

a recess formed in the rear surface of the ceramic plate;

a temperature measuring member including a temperature sensor, leads for connecting the temperature sensor and a protective tube for covering the temperature sensor, the protective tube being inserted in the bottom side of the recess; and a filling which is inserted in the recess to hold the protective tube secured therein;

wherein a length along the leads from the front end of the protective tube to a point where the leads are exposed from the end portion of the filling is set in a range of 5 to 30 times the outer diameter of the protective tube, wherein the shortest distance from the center of the temperature sensor to the heat resistance element is sat to satisfy the following relationship:

$$L_2 - 6 \cdot A < L_1 < L_2 - 2 \cdot A$$

where $L_1$ is the shortest distance from the center of the temperature sensor to the heat resistance element; A is the outer diameter of the protective tube; and $L_2$ is the shortest distance from an intersection at which a normal extended from the temperature sensor to the front surface of the ceramic plate intersects the front surface of the ceramic plate to the resistance heating element.

2. The wafer heating apparatus according to claim 1, wherein the filling has a thermal conductivity of 0.60 to 3.00 times that of the ceramic plate.

3. The wafer heating apparatus according to claim 2, wherein the filling comprises a metal having Vickers hardness of not more than 50.

4. The wafer heating apparatus according to claim 1, wherein the temperature sensor in the recess is disposed parallel to an upper bottom surface of the recess.

5. The wafer heating apparatus according to claim 1, wherein the temperature sensor comprises a wire containing a major component of platinum.

6. A wafer heating apparatus comprising a ceramic plate having a front surface of the ceramic plate serving as a mounting surface for mounting a wafer and a recess formed in the ceramic plate opening to a rear surface of the ceramic plate;

a resistance heating element attached on the rear surface of the ceramic plate or buried within the ceramic plate;

a recess formed in the rear surface of the ceramic plate;

a temperature measuring member including a temperature sensor, leads for connecting the temperature sensor, the protective tube being inserted in the bottom side of the recess; and a filling which is inserted in the recess to hold the protective secured therein;

wherein a length along the leads from the front end of the protective tube to a point where the leads are exposed from the end portion of the filling is set in a range 5 to 30 times the outer diameter of the protective tube and further the protective tube is in face-contact with a bottom portion of the recess through a thermal conductive element having a thickness of 50 to 200 $\mu$m.

* * * * *